(12) United States Patent
Goldstein

(10) Patent No.: US 6,577,442 B2
(45) Date of Patent: Jun. 10, 2003

(54) REFLECTIVE SPECTRAL FILTERING OF HIGH POWER EXTREME ULTRA-VIOLET RADIATION

(75) Inventor: Michael Goldstein, Ridgefield, CT (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/965,170

(22) Filed: Sep. 27, 2001

(65) Prior Publication Data

US 2003/0058529 A1 Mar. 27, 2003

(51) Int. Cl.[7] ................................................. F21V 9/06
(52) U.S. Cl. ........................ 359/361; 359/359; 359/360; 359/565; 359/566
(58) Field of Search ................................. 359/361, 359, 359/360, 565, 566, 572, 571, 576, 584, 585, 586, 350, 351, 355, 858, 859; 378/34, 35

(56) References Cited

U.S. PATENT DOCUMENTS

| | | | | |
|---|---|---|---|---|
| 4,114,978 A | * | 9/1978 | Bostick et al. | 359/360 |
| 5,936,752 A | * | 8/1999 | Bishop et al. | 359/124 |
| 6,159,643 A | * | 12/2000 | Levinson et al. | 430/5 |
| 6,178,221 B1 | * | 1/2001 | Levinson et al. | 378/35 |
| 6,285,497 B1 | * | 9/2001 | Sweatt et al. | 359/351 |
| 6,392,792 B1 | * | 5/2002 | Naulleau | 359/360 |
| 6,455,004 B1 | * | 9/2002 | Tiefenthaler | 422/91 |

* cited by examiner

Primary Examiner—Mohammad Sikder
(74) Attorney, Agent, or Firm—Blakely, Sokoloff, Taylor & Zafman LLP

(57) ABSTRACT

In one embodiment of the invention, a grating structure etched on a mirror substrate has a grating period causing diffracting, out of an optical path, a first incident radiation within a first band around a first wavelength. A multi-layer coating deposited on the grating structure reflects the first incident radiation, in the optical path, within the first band and a second incident radiation within a second band around a second wavelength. In another embodiment, a first multi-layer coating deposited on a mirror substrate reflects a first incident radiation within a first band around a first wavelength and a second incident radiation, in an optical path, within a second band around a second wavelength. A grating structure is deposited on the first multi-layer coating. The grating structure is etched to have a grating period causing diffracting, out of the optical path, the second incident radiation within the second band.

20 Claims, 6 Drawing Sheets

REFLECTIVE SPECTRAL FILTERING OF HIGH POWER EXTREME ULTRA-VIOLET RADIATION

BACKGROUND

1. Field of the Invention

This invention relates to lithography. In particular, the invention relates to extreme ultra-violet (EUV) lithography.

2. Description of Related Art

Extreme ultraviolet (EUV) lithography is an imaging technology with higher resolution capabilities than are available from longer wavelength exposure tools. The very short exposure wavelength requires an all reflective lens system because refractive materials are not sufficiently transparent. The EUV technique bounces EUV photons off a system of mirrors, including a mask made of reflective materials, that is ultimately focused on a resist-coated silicon wafer. By doing so, EUV systems can pattern features smaller than 0.05 micrometer.

Present EUV radiation sources have a very broad-band emission spectrum. For example, Xe laser pulsed plasma (LPP-Xe) sources have in excess of 40% of their radiation at wavelengths longer than 125 nanometers (nm) and approximately 60% of the energy is at wavelengths that are longer than 17 nm. EUV lithography tools for high volume manufacturing may require about 13.4 nm +/−1% wavelength radiation. Power levels are expected to be in the range between 50 and 100 Watts. Thus, kilowatts of energy potentially need to be filtered from the source spectra. Otherwise, it would unreasonably distort the mask and mirrors used in EUV imaging tools.

Existing techniques include use of ultra-thin transmission filters based on coating of a membrane on support structures. This technique has low efficiency, typically passing only about 50% of the desired wavelength. In addition, the membrane filters are easy to rupture at high power levels because of absorption. Another technique uses monochrometer and diffraction of the actinic 13.4 nm light. This technique is substantially less efficient and is generally used with only synchroton sources. Yet, another technique uses cooled Mo/Si multi-layer coated mirrors. This technique operates only through absorption and selective reflection, leading to problems in heating and a lack of long wavelength filtering.

Therefore, there is a need to have an efficient technique for spectral filtering of high power EUV radiation.

BRIEF DESCRIPTION OF THE DRAWINGS

The features and advantages of the present invention will become apparent from the following detailed description of the present invention in which.

DESCRIPTION OF THE INVENTION

The present invention is a technique for efficient spectral filtering of EUV radiation. The spectral filter includes a grating structure and a multi-layer coating. The multi-layer coating is designed to reflect a narrow band around a short wavelength (e.g., 13.4 nm) and also reflects long wavelengths (e.g., greater than approximately 60 nm). The grating structure has a grating period responsive to the long wavelength band. The multi-layer coating is formed by layers of materials having high and low atomic numbers (e.g., Mo and Si) interspersed by layers of a compound (e.g., SiC). Regions of the longer wavelength rays are removed from the optical path by diffraction. The actinic rays have a wavelength much shorter than the grating period and undergoes simple reflection. The combined properties of the multi-layer coating and the grating structure generate the desired spectral characteristics.

In the following description, for purposes of explanation, numerous details are set forth in order to provide a thorough understanding of the present invention. However, it will be apparent to one skilled in the art that these specific details are not required in order to practice the present invention. In other instances, well-known structures are shown in block diagram form in order not to obscure the present invention.

Figure 1:
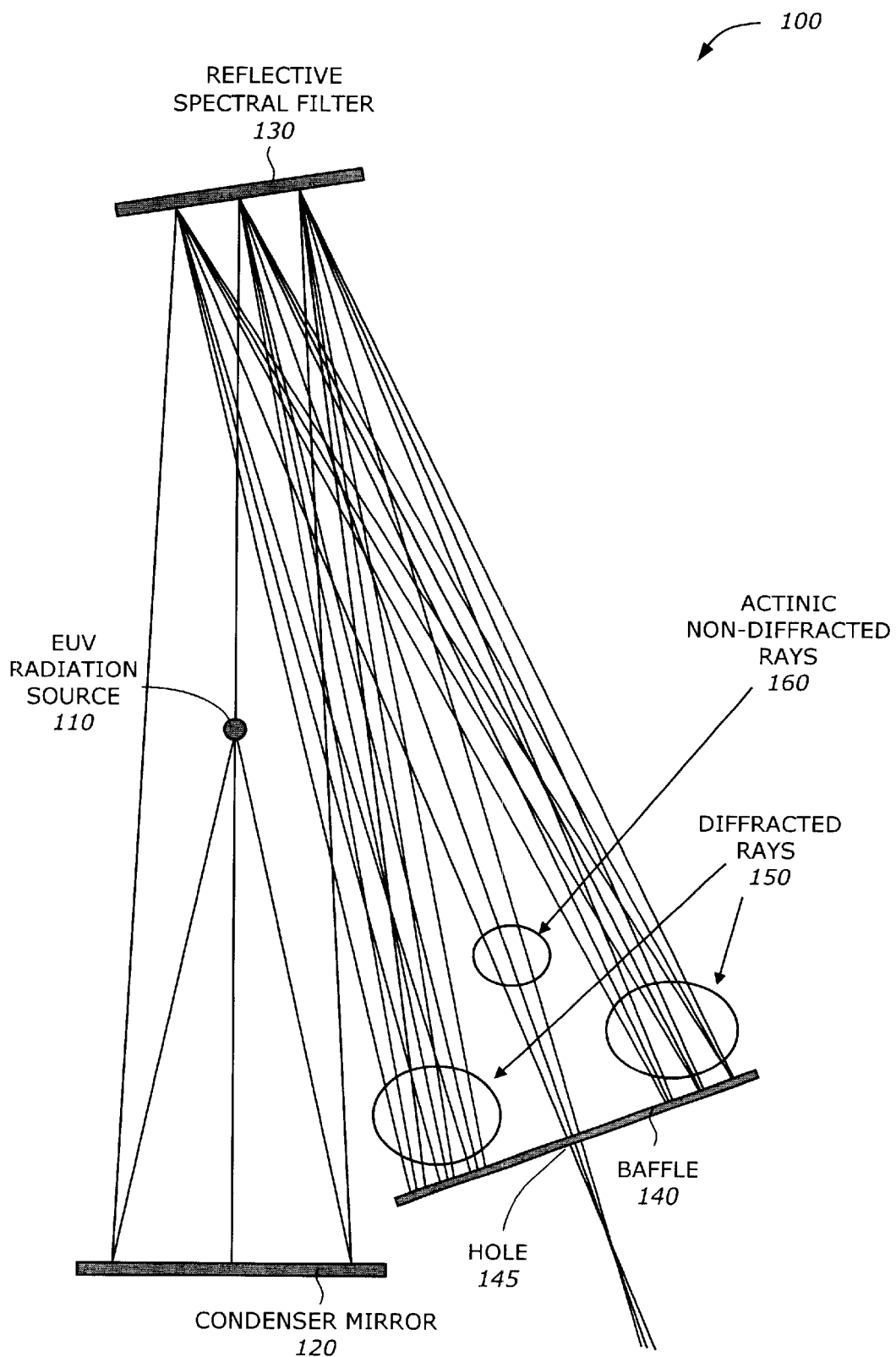
FIG. 1 is a diagram illustrating a system using a reflective spectral filter in which one embodiment of the invention can be practiced.

FIG. 1 is a diagram illustrating a system using a reflective spectral filter in which one embodiment of the invention can be practiced. The system 100 includes an EUV radiation source 110, a condenser mirror 120, a reflective spectral filter 130, and a baffle 140. The system 100 is typically used in EUV lithography.

The EUV radiation source 110 is a laser pulsed plasma source. A Xenon (Xe) gas jet is hit with a high power laser pulse. Ionization and recombination generates spectral lines ranging from X-ray to Infra-red. As is known by one skilled in the art, any other methods to provide the EUV radiation source can be employed.

The condenser mirror 120 is an optical subsystem to collect the EUV radiation from the EUV radiation source 110.

The reflective spectral filter 130 receives the source radiation as provided by the condenser mirror 120 and to reflect actinic rays 160 and diffracted rays 150. In one embodiment, the actinic rays are radiation at 13.4 nm and the diffracted rays 150 are at wavelengths longer than the actinic wavelength (e.g., 60 nm). The reflective spectral filter 130 will be described in FIGS. 2 and 3.

The baffle 140 is a metal plate to stop the diffracted rays 150. The baffle 140 has a hole 145 aligned with the principal optical path of the spectral filter 130. The actinic rays 160 are on the optical path and go through the hole 145.

Figure 2:
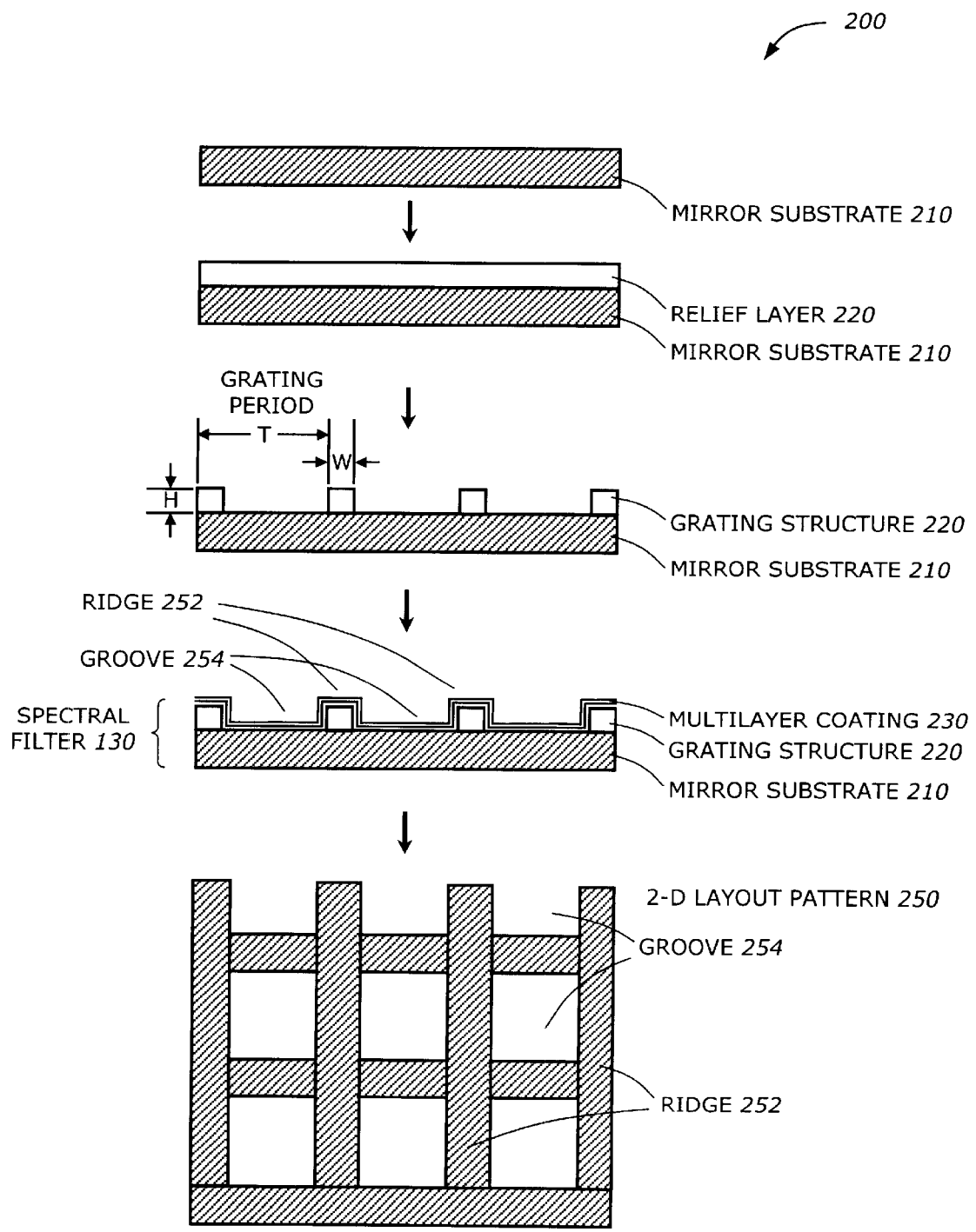
FIG. 2 is a diagram illustrating a process to fabricate the reflective spectral filter shown in FIG. 1 according to one embodiment of the invention.

FIG. 2 is a diagram illustrating a process 200 to fabricate the reflective spectral filter 130 shown in FIG. 1 according to one embodiment of the invention.

The process 200 starts with polishing a blank mirror substrate 210. The mirror substrate 210 may have a flat or curved surface. The mirror substrate 210 may be made of Zerodur, ULE, or composites with low coefficients of thermal expansion that can be polished well. Then, a relief material or a photo-resist layer 220 is deposited on the mirror substrate 210.

Next, the relief layer 220 is lithographically patterned and etched to form a grating structure 220. The grating structure 220 has a plurality of ridges spaced at a grating period T. It is noted that although the preferred embodiment has a periodic pattern of ridges, it is contemplated that non-periodic pattern may also be used. The ridge shape is not restricted to the rectangular cross-section shown and could be triangular or other possibilities. The grating structure 220 may have a one-dimensional layout or a two-dimensional layout. The layout pattern 250 shows a representative two-dimensional layout having ridges 252 and grooves 254. The grating period T is selected to be responsive to a band around a design filter wavelength and selected harmonics. The grating period T is selected to cause diffracting, out of an optical path, an incident radiation within the band of the design filter wavelength. The design filter wavelength may be 60 nm corresponding to when coating reflectivity begins to increase, 140 nm corresponding to significant emission spectra of the EUV source, or other possibilities. The ridges have a ridge width W and height H. The ridge width W is typically less than the grating period T. In one embodiment, the ridge width W is approximately proportionally to the grating period T with a proportionality constant α. In one embodiment, the proportionality constant α may be approximately equal to one-half. The ridge height H may be any suitable number. In one embodiment, the ridge height H is approximately proportionally to the grating period T with a proportionality constant β. The proportionality constant β may be an odd integer number times a quarter of the design filter wavelength. Typical values of the ridge height H may be 35 nm, 105 nm, and 175 nm.

Then, a multi-layer coating 230 is deposited conformally on the grating structure 220 and the mirror substrate 210. The multi-layer coating 230 has a number of layers, or stack, of first and second materials having either high and low atomic numbers, respectively, or high and low densities of charge carriers, respectively.

In one embodiment, the first material is molybdenum (Mo) and the second material is silicon (Si) or beryllium (Be). The multi-layer coating 230 may also have a number of layers of a compound interspersed within the layers of the first and second materials. In one embodiment, the compound is silicon carbide (SiC). The incorporation of the compound SiC in the stack improves heating durability with minimal reduction (e.g., 3% to 5%) in reflectivity.

The reflective spectral filter 130 in this embodiment therefore includes a multi-layer coating 230, the grating structure 220, and the mirror substrate 210. The multi-layer coating 230 is designed to be reflective at around the actinic wavelength (e.g., 13.4 nm) in an optical path and wavelengths longer than the actinic wavelength (e.g., 60 nm, 140 nm). With this construction, wavelengths that are both near the grating period T and that reflect from the multi-layer coating 230 are diffracted away (diffracted rays 150 shown in FIG. 1) from the path of the actinic rays (actinic rays 160 shown in FIG. 1).

Figure 3:
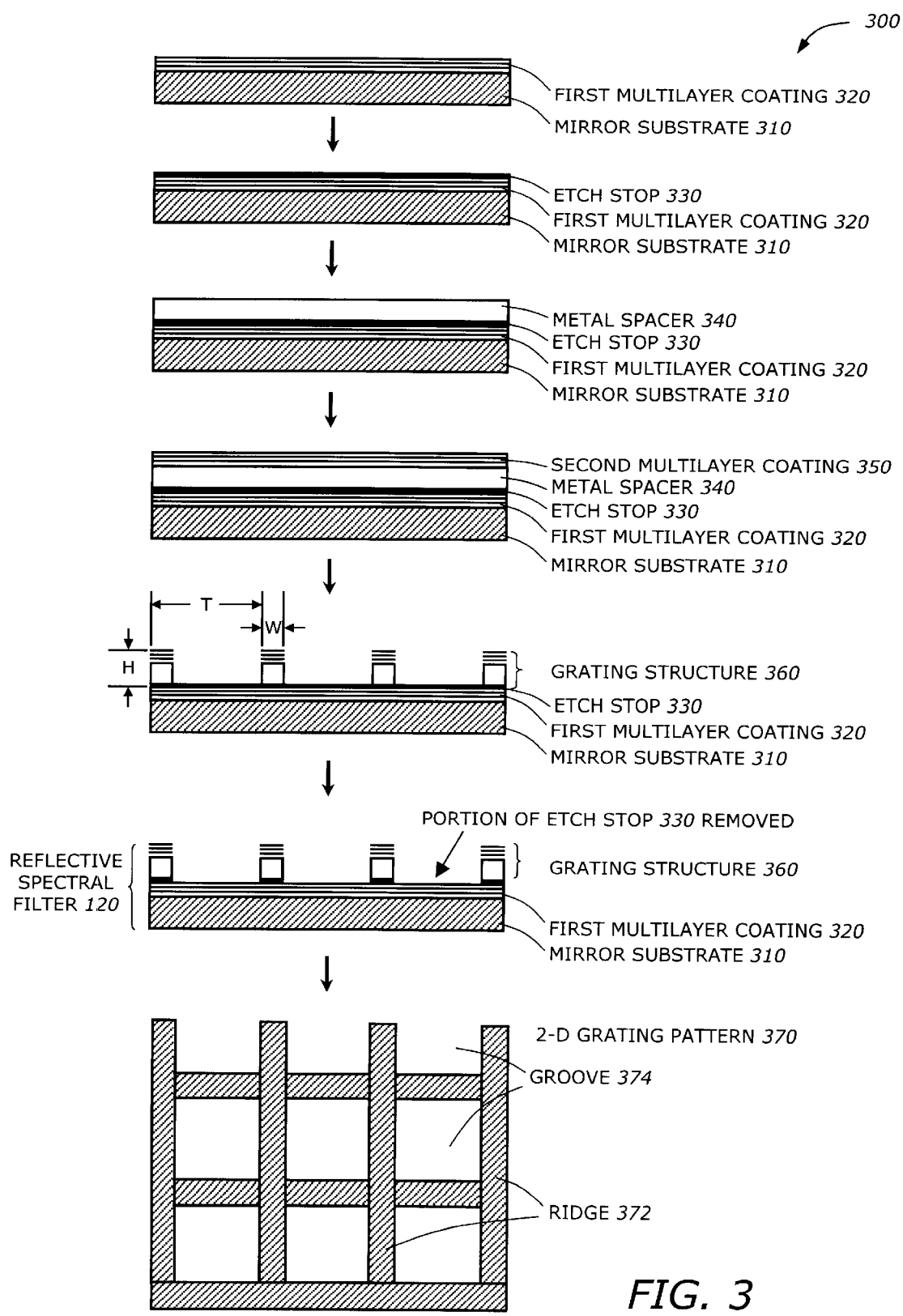
FIG. 3 is a diagram illustrating a process to fabricate a reflective spectral filter shown in FIG. 1 according to another embodiment of the invention.

FIG. 3 is a diagram illustrating a process 300 to fabricate the reflective spectral filter 130 shown in FIG. 1 according to another embodiment of the invention.

The process 300 starts with polishing a mirror substrate 310. This step is much similar to the step shown in FIG. 2. Next, a first multi-layer coating 320 is deposited on the mirror substrate 310. The first multi-layer coating 320 is made of materials similar to the multi-layer coating 230 in FIG. 2. It includes a number of layers, or stack, of first and second materials having either high and low atomic numbers, respectively, or high and low densities of charge carriers, respectively.

In one embodiment, the first material is molybdenum (Mo) and the second material is silicon (Si) or beryllium (Be). The multi-layer coating 230 may also have a number of layers of a compound interspersed within the layers of the first and second materials. In one embodiment, the compound is silicon carbide (SiC).

Then, an etch stop layer 330 is optionally deposited on the multi-layer coating 320. The etch stop layer 330 may be made by SiC or any other suitable material. The etch stop 330 is used so that subsequent etching does not cut into the multi-layer coating 320.

Next, a metal spacer layer 340 is deposited on the etch stop layer 330 to provide grating relief layer. Then, a second multi-layer coating 350 is deposited on the metal spacer layer 340. This second multi-layer coating 350 is essentially the same as the first multi-layer coating 320. Both the multi-layer coatings 350 and 320 are designed to be reflective at around the actinic wavelength (e.g., 13.4 nm). Note that the metal spacer layer 340 may not be needed. In addition, the second multi-layer coating 350 may not be needed leaving only the metal spacer layer 340.

The process 300 then lithographically patterns and etches a grating structure 360 from the second multi-layer coating 350 and the metal spacer layer 340. The grating structure 360 may have a one-dimensional layout or a two-dimensional layout. The layout pattern 370 shows a representative two-dimensional layout having ridges 372 and grooves 374. The grating structure 360 has a grating period T responsive to a band around a longer design filter wavelength (e.g., 60 nm) and selected harmonics. The grating period T is selected to cause diffracting, out of an optical path, an incident radiation within this band around of the design filter wavelength. Finally, the portion of the etch stop layer 330 that is exposed is removed. Alternatively, the etch stop layer 330 may be left on the first multi-layer coating if it is thin and transparent. The grating structure 360 includes a number of ridges spaced at the grating period T. Similar to the grating structure 220 in FIG. 2, the ridges have a ridge width W and height H. The ridge width W and height H may be any suitable values. In one embodiment, the ridge width W is approximately proportionally to the grating period T with a proportionality constant α. The ridge height H is approximately proportionally to the grating period T with a proportionality constant β.

Similar to the embodiment shown in FIG. 2, the reflective spectral filter 130 in this embodiment therefore includes a first multi-layer coating 320, the grating structure 360, and the mirror substrate 310. The grating structure 360 may include a metal spacer 340 only, a second multi-layer coating 350 only, or a combination of the metal spacer 340 and the second multi-layer coating 350 as shown. The first and second multi-layer coatings 320 and 340 are designed to be reflective at around the actinic wavelength (e.g., 13.4 nm) in an optical path. With this construction, wavelengths that are both near the grating period T and that reflect from the multi-layer coatings 320 and 340 are diffracted away (diffracted rays 150 shown in FIG. 1) from the path of the actinic rays (actinic rays 160 shown in FIG. 1).

An electromagnetic (EM) simulation is performed to study the effects of the reflective multi-layer coating. The results of the simulation are shown in Table 1 and FIG. 4. Table 1 shows components of the multi-layer coating as used in FIGS. 2 and 3. It is noted that the materials and thickness are merely for illustrative purposes.

TABLE 1

Multi-layer coating components

| No. | Layer | Thickness (nm) |
|---|---|---|
| 1 | Si | 3.48 |
| 2 | Mo | 3.69 |
| 3 | SiC | 3.40 |
| 4 | Mo | 3.60 |
| 5 | Si | 3.41 |
| 6 | Mo | 3.58 |
| 7 | Si | 3.41 |
| 8 | Mo | 3.63 |
| 9 | SiC | 3.46 |
| 10 | Mo | 3.53 |
| 11 | Si | 3.45 |
| 12 | Mo | 3.51 |
| 13 | Si | 3.47 |
| 14 | Mo | 3.59 |
| 15 | SiC | 3.49 |
| 16 | Mo | 3.46 |
| 17 | Si | 3.52 |
| 18 | Mo | 3.44 |
| 19 | Si | 3.54 |
| 20 | Mo | 3.54 |
| 21 | SiC | 3.52 |
| 22 | Mo | 3.38 |
| 23 | Si | 3.59 |
| 24 | Mo | 3.35 |
| 25 | Si | 3.62 |
| 26 | Mo | 3.49 |
| 27 | SiC | 3.56 |
| 28 | Mo | 3.29 |
| 29 | Si | 3.66 |
| 30 | Mo | 3.26 |
| 31 | Si | 3.69 |
| 32 | Mo | 3.45 |
| 33 | SiC | 3.60 |
| 34 | Mo | 3.21 |
| 35 | Si | 3.73 |
| 36 | Mo | 3.17 |
| 37 | Si | 3.77 |
| 38 | Mo | 3.40 |
| 39 | SiC | 3.64 |
| 40 | Mo | 3.13 |
| 41 | Si | 3.80 |
| 42 | Mo | 3.10 |
| 43 | Si | 3.83 |
| 44 | Mo | 3.36 |
| 45 | SiC | 3.67 |
| 46 | Mo | 3.07 |
| 47 | Si | 3.86 |
| 48 | Mo | 3.04 |
| 49 | Si | 3.89 |
| 50 | Mo | 3.33 |
| 51 | SiC | 3.70 |
| 52 | Mo | 3.02 |
| 53 | Si | 3.90 |
| 54 | Mo | 2.99 |
| 55 | Si | 3.93 |
| 56 | Mo | 3.31 |
| 57 | SiC | 3.72 |
| 58 | Mo | 2.98 |
| 59 | Si | 3.93 |
| 60 | Mo | 2.95 |
| 61 | Si | 3.96 |
| 62 | Mo | 3.29 |
| 63 | SiC | 3.74 |
| 64 | Mo | 2.95 |
| 65 | Si | 3.95 |
| 66 | Mo | 2.93 |
| 67 | Si | 3.98 |
| 68 | Mo | 3.28 |
| 69 | SiC | 3.75 |
| 70 | Mo | 2.94 |
| 71 | Si | 3.97 |
| 72 | Mo | 2.91 |
| 73 | Si | 3.99 |
| 74 | Mo | 3.27 |
| 75 | SiC | 3.75 |
| 76 | Mo | 2.92 |
| 77 | Si | 3.98 |
| 78 | Mo | 2.90 |
| 79 | Si | 4.00 |
| 80 | Mo | 3.26 |
| 81 | SiC | 3.76 |
| 82 | Mo | 2.91 |
| 83 | Si | 3.99 |
| 84 | Mo | 2.89 |
| 85 | Si | 4.01 |
| 86 | Mo | 3.26 |
| 87 | SiC | 3.76 |
| 88 | Mo | 2.91 |
| 89 | Si | 3.99 |
| 90 | Mo | 2.89 |
| 91 | Si | 4.01 |
| 92 | Mo | 2.6 |

Figure 4:
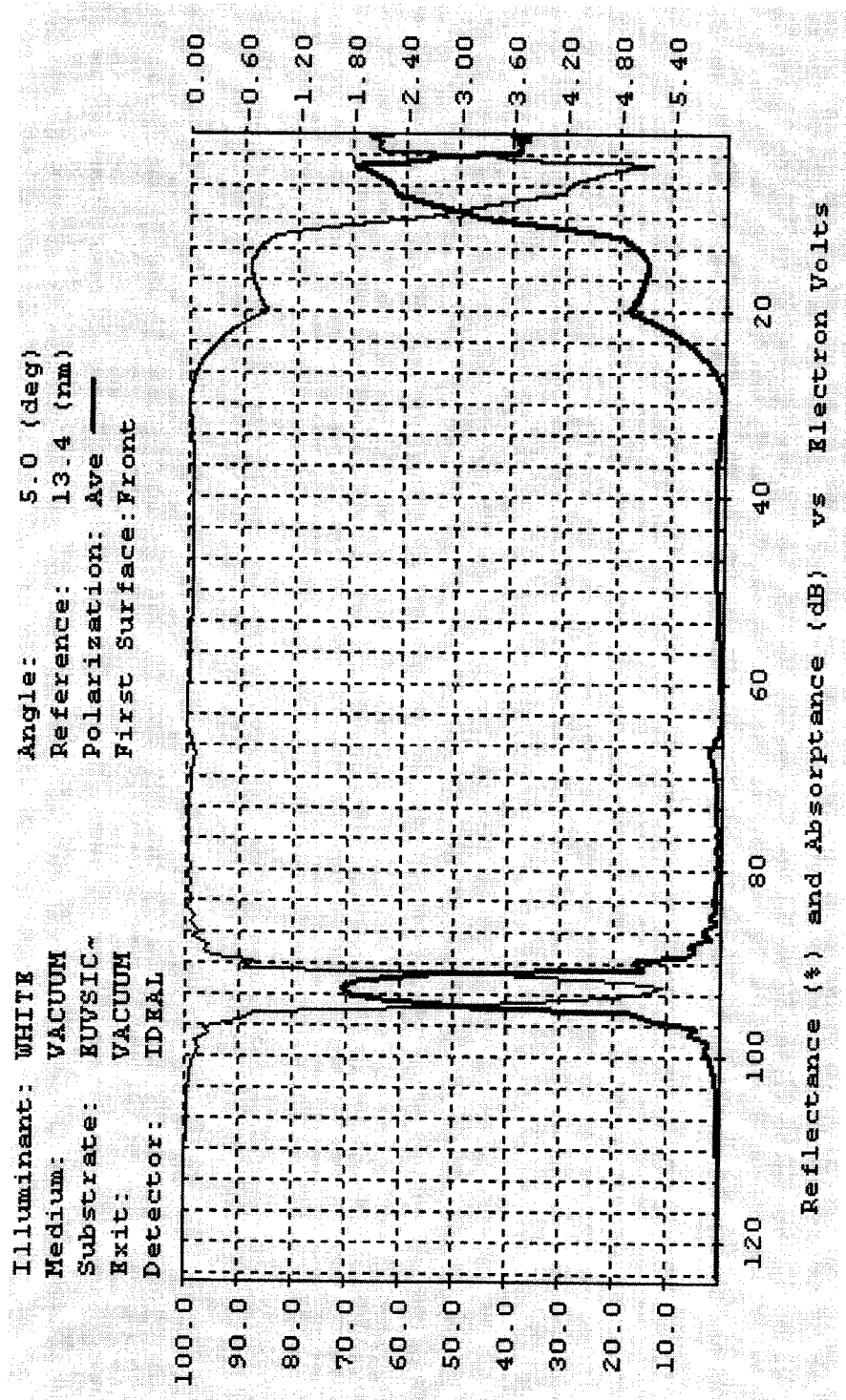
FIG. 4 is a diagram illustrating reflectance and absorption spectra for the multi-layer coatings according to another embodiment of the invention.

FIG. 4 is a diagram illustrating reflectance and absorption spectra for the layer coatings according to one embodiment of the invention. The diagram high reflectivity at the design wavelength of 13.4 nm (92.5 eV) and also ted wavelengths longer than 60 nm (less then 20.7 eV).

The diagram shows the reflectance and absorption spectra for a white (flat) source from a {Si (Mo SiC Mo Si Mo Si)^15 Mo Si} multi-layer with thickness optimized for a 5-degree incidence. The total number of layers is 92. The total Mo thickness is 147.97 nm. The total Si thickness is 117.31 nm. The total number of SiC thickness is 54.54 nm.

It is clear from the diagram that the reflectance is maximum at two places: a narrow band around 13.4 nm and a narrow band around 60 nm. The absorption spectrum is correspondingly minimum at these two bands.

Figure 5:
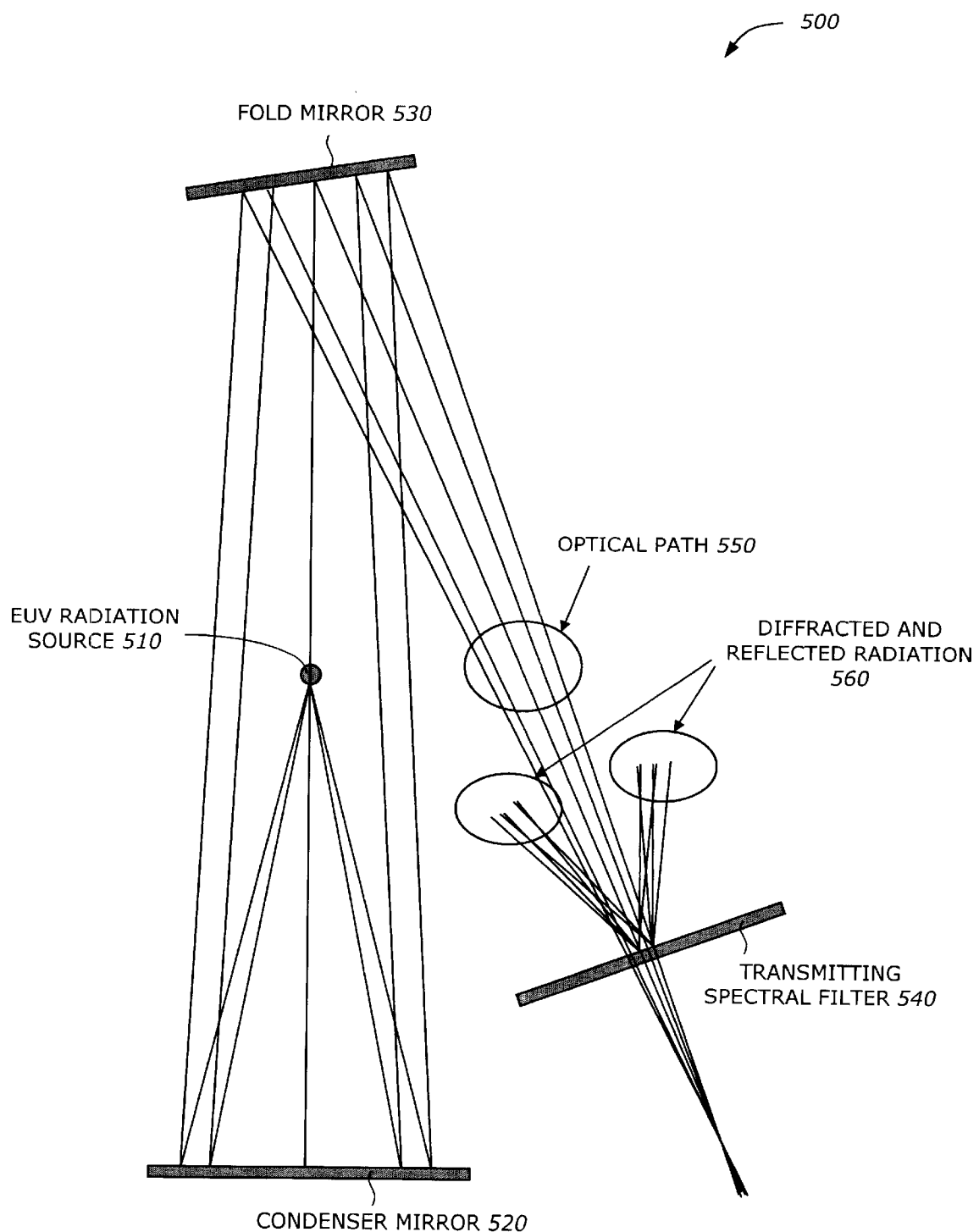
FIG. 5 is a diagram illustrating a system using a transmitting spectral filter in which one embodiment of the invention can be practiced.

FIG. 5 is a diagram illustrating a system 500 using a transmitting spectral filter in which one embodiment of the invention can be practiced. The system 500 includes an EWV radiation source 510, a condenser mirror 520, a fold mirror 530, and a transmitting spectral filter 540. The system 500 is typically used in EUV lithography.

The EUV radiation source 510 and the condenser mirror 520 are the same as the EUV radiation source 210 and the condenser mirror 220 shown in FIG. 2. The fold mirror 530 is standard mirror that reflects the incident radiation from the condenser mirror 520. The fold mirror 530 may have multi-layer coating that reflects a narrow band around a design wavelength (e.g., 13.4 nm) and wavelengths longer than a second wavelength (e.g., 60 nm). The reflected radiation forms an optical path 550.

The transmitting spectral filter 540 is inserted into the optical path 550. The transmitting spectral filter 540 has a grating structure or a metal mesh with a low aspect ration supported on an ultra-thin layer of transmitting material (e.g., Nitride, Oxide). The desired actinic rays (e.g., the 13.4 nm rays) are much shorter than the period of the mesh or the grating structure and pass through the transmitting spectral filter 540 with little blocking. The rays having longer wavelengths that are near the period of the mesh or the grating structure are not transmitted and undergo reflection and diffraction, forming the reflected and diffracted rays 560.

Figure 6:
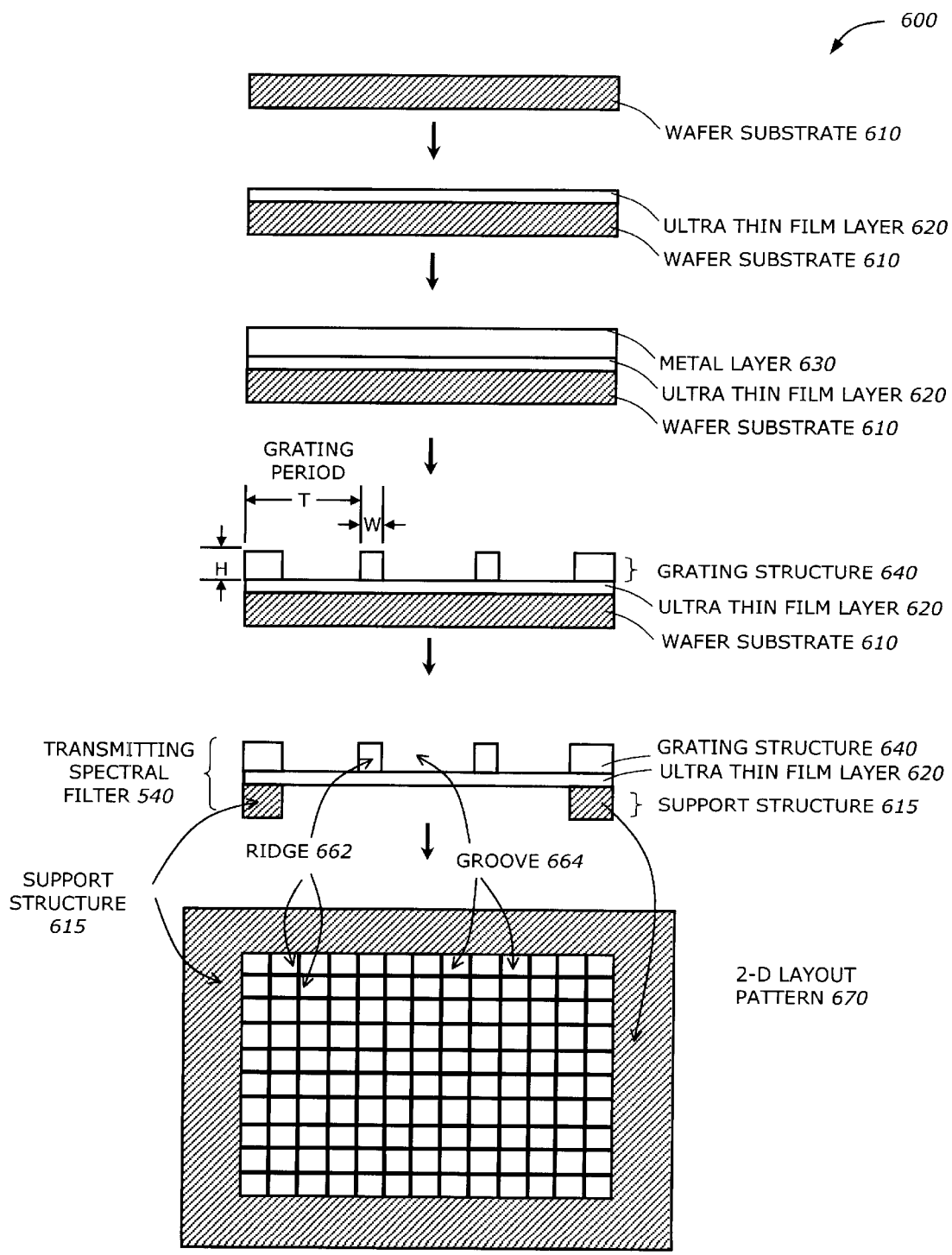
FIG. 6 is a diagram illustrating a process to fabricate the transmitting spectral filter shown in FIG. 5 according to one embodiment of the invention.

FIG. 6 is a diagram illustrating a process 600 to fabricate the transmitting spectral filter 540 shown in FIG. 5 according to one embodiment of the invention.

The process 600 starts with polishing a wafer blank 610. Then, an ultra-thin film layer 620 is deposited on the wafer blank 610. The ultra-thin film layer 620 is made of a transmitting material such as Nitride or Oxide or any other material that has high transmittance.

Next, a metal layer 630 is deposited on the ultra-thin film layer 620. Then, the metal layer 630 is lithographically patterned and etched to become a metal mesh or a grating structure 640. The grating structure 640 may have a one-dimensional layout or a two dimensional layout. The grating structure 640 has a grating period T responsive to rays that have wavelengths longer than a design wavelength (e.g., 13.4 nm). Specifically, the grating structure 640 has a grating period selected to reflect or diffract incident radiation having wavelengths longer than the second wavelength (e.g., 60 nm). The grating structure 640 has a number of ridges spaced at the grating period T. The ridges have a ridge width W and height H. The ridge width W and height H may be of any suitable values to provide the desired characteristics. In one embodiment, the ridge width W is approximately proportionally to the grating period T with a proportionality constant of $\gamma$. A typical value of $\gamma$ is much less than 0.5.

Then, the process 600 lithographically patterns and etches the back side of the wafer 610 to form a support structure 615. The support structure 615 provides support or frame for the thin-film layer 620 and the grating structure 640. The layout pattern 660 shows a representative two-dimensional layout having ridges 662, grooves 664, and support structure 615.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a grating structure on a mirror substrate etched to have a grating period causing diffracting, out of an optical path, a first incident radiation within a first band around a first wavelength, and
   a multi-layer coating deposited on the grating structure that reflects the first incident radiation, in the optical path, within the first band and a second incident radiation within a second band around a second wavelength.

2. The apparatus of claim 1 wherein the grating structure has one of a one-dimensional layout and a two-dimensional layout.

3. The apparatus of claim 1 wherein the grating structure comprises:
   a plurality of ridges spaced at the grating period, the ridges having a ridge width and height, the ridge width being approximately proportionally to the grating period with a first proportionality constant, the ridge height being approximately proportionally to the grating period with a second proportionality constant.

4. The apparatus of claim 1 wherein the first wavelength is longer than approximately 60 nm.

5. The apparatus of claim 1 wherein the second wavelength is at approximately 13.4 nm.

6. The apparatus of claim 1 wherein the multi-layer coating comprises:
   a plurality of layers of first and second materials having one of high and low atomic numbers, respectively, and high and low densities of charge carriers, respectively.

7. The apparatus of claim 6 wherein the first material is molybdenum (Mo).

8. The apparatus of claim 6 wherein the second material is one of silicon (Si) and beryllium (Be).

9. The apparatus of claim 6 wherein the multi-layer coating further comprises:
   a plurality of layers of a compound interspersed within the plurality of the first and second materials.

10. The apparatus of claim 9 wherein the compound is silicon carbide (SiC).

11. A system comprising:
    a mirror to reflect an extreme ultra violet (EUV) radiation;
    a baffle having an opening positioned to stop diffracted radiation rays and allowing actinic radiation rays to pass through the opening; and
    a reflective spectral filter positioned to generate the diffracted radiation rays and the actinic radiation rays from the reflected EUV radiation, the reflective spectral filter comprising:
    a grating structure on a mirror substrate etched to have a grating period causing diffracting, out of an optical path, a first band around a first wavelength, and
    a multi-layer coating deposited on the grating structure that reflects the first incident radiation, in an optical path, within the first band and a second incident radiation within a second band around a second wavelength.

12. The system of claim 11 wherein the grating structure has one of a one-dimensional layout and a two-dimensional layout.

13. The system of claim 11 wherein the grating structure comprises:
    a plurality of ridges spaced at the grating period, the ridges having a ridge width and height, the ridge width being approximately proportionally to the grating period with a first proportionality constant, the ridge height being approximately proportionally to the grating period with a second proportionality constant.

14. The system of claim 11 is wherein the first wavelength is longer than approximately 60 nm.

15. The system of claim 11 wherein the second wavelength is at approximately 13.4 nrm.

16. The system of claim 11 wherein the multi-layer coating comprises:
    a plurality of layers of first and second materials having one of high and low atomic numbers, respectively, and high and low densities of charge carriers, respectively.

17. The system of claim 16 wherein the first material is molybdenum (Mo).

18. The system of claim 16 wherein the second material is one of silicon (Si) and beryllium (Be).

19. The system of claim 16 wherein the multi-layer coating further comprises:
    a plurality of layers of a compound interspersed within the plurality of the first and second materials.

20. The system of claim 19 wherein the compound is silicon carbide (SiC).

* * * * *

UNITED STATES PATENT AND TRADEMARK OFFICE
CERTIFICATE OF CORRECTION

PATENT NO. : 6,577,442 B2
DATED : June 10, 2003
INVENTOR(S) : Goldstein

It is certified that error appears in the above-identified patent and that said Letters Patent is hereby corrected as shown below:

Column 4,
Line 34, delete "harrnonics", insert -- harmonics --.

Column 6,
Line 27, delete "layer", insert -- multi-layer --.
Line 28, before "high", insert -- shows --.
Line 29, delete "ted", insert -- unwanted --.
Line 44, delete "EWV", insert -- EUV --.

Signed and Sealed this

Twenty-fifth Day of November, 2003

JAMES E. ROGAN
*Director of the United States Patent and Trademark Office*